(12) United States Patent
Chang et al.

(10) Patent No.: US 10,686,059 B2
(45) Date of Patent: Jun. 16, 2020

(54) STRUCTURE OF SEMICONDUCTOR DEVICE STRUCTURE HAVING FINS

(71) Applicant: Taiwan Semiconductor Manufacturing Company, Ltd., Hsinchu (TW)

(72) Inventors: Che-Cheng Chang, New Taipei (TW); Jui-Ping Chuang, Hsinchu (TW); Chen-Hsiang Lu, Hsinchu (TW); Yu-Cheng Liu, Zhubei (TW); Wei-Ting Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/017,795

(22) Filed: Jun. 25, 2018

(65) Prior Publication Data
US 2018/0308956 A1 Oct. 25, 2018

Related U.S. Application Data

(60) Continuation of application No. 15/414,449, filed on Jan. 24, 2017, now Pat. No. 10,014,394, which is a
(Continued)

(51) Int. Cl.
*H01L 29/66* (2006.01)
*H01L 29/78* (2006.01)
(Continued)

(52) U.S. Cl.
CPC .. *H01L 29/66795* (2013.01); *H01L 21/31111* (2013.01); *H01L 21/76224* (2013.01);
(Continued)

(58) Field of Classification Search
CPC ......... H01L 21/823821; H01L 27/0924; H01L 29/7855–7856; H01L 21/31111;
(Continued)

(56) References Cited

U.S. PATENT DOCUMENTS 8,586,436 B2  11/2013  Ng et al.
8,846,491 B1 *  9/2014  Pham ................ H01L 21/76224
                                                257/E21.409
(Continued)

FOREIGN PATENT DOCUMENTS

CN    103077947 A    5/2013
JP    2009158813 A   7/2009
(Continued)

*Primary Examiner* — Shahed Ahmed
(74) *Attorney, Agent, or Firm* — Slater Matsil, LLP

(57) ABSTRACT

Structures and formation methods of a semiconductor device structure are provided. The semiconductor device structure includes a fin structure over a semiconductor substrate. The semiconductor device structure also includes a gate stack covering a portion of the fin structure, and the gate stack includes a work function layer and a metal filling over the work function layer. The semiconductor device structure further includes an isolation element over the semiconductor substrate and adjacent to the gate stack. The isolation element is in direct contact with the work function layer and the metal filling.

18 Claims, 12 Drawing Sheets

Related U.S. Application Data division of application No. 14/725,555, filed on May 29, 2015, now Pat. No. 9,553,090.

(51) Int. Cl.

| | |
|---|---|
| *H01L 21/8238* | (2006.01) |
| *H01L 27/092* | (2006.01) |
| *H01L 29/06* | (2006.01) |
| *H01L 29/423* | (2006.01) |
| *H01L 29/08* | (2006.01) |
| *H01L 29/16* | (2006.01) |
| *H01L 29/161* | (2006.01) |
| *H01L 29/165* | (2006.01) |
| *H01L 29/24* | (2006.01) |
| *H01L 29/267* | (2006.01) |
| *H01L 29/49* | (2006.01) |
| *H01L 29/51* | (2006.01) |
| *H01L 21/311* | (2006.01) |
| *H01L 21/762* | (2006.01) |

(52) U.S. Cl.
CPC ........ *H01L 21/823814* (2013.01); *H01L 21/823821* (2013.01); *H01L 21/823842* (2013.01); *H01L 21/823857* (2013.01); *H01L 21/823878* (2013.01); *H01L 27/0922* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/24* (2013.01); *H01L 29/267* (2013.01); *H01L 29/42372* (2013.01); *H01L 29/4966* (2013.01); *H01L 29/517* (2013.01); *H01L 29/66545* (2013.01); *H01L 29/66553* (2013.01); *H01L 29/785* (2013.01); *H01L 29/7848* (2013.01); *H01L 29/7851* (2013.01)

(58) Field of Classification Search
CPC ....... H01L 21/76224; H01L 21/823814; H01L 27/0922; H01L 21/823878; H01L 29/0653; H01L 29/41791; H01L 29/42372; H01L 29/66545; H01L 21/823431; H01L 21/845; H01L 27/0886; H01L 27/10826; H01L 29/66772
See application file for complete search history.

(56) References Cited

U.S. PATENT DOCUMENTS

| | | |
|---|---|---|
| 2005/0087810 A1 | 4/2005 | Sadra et al. |
| 2007/0281455 A1 | 12/2007 | Kim |
| 2008/0057672 A1 | 3/2008 | Rossi et al. |
| 2009/0166726 A1 | 7/2009 | Mine |
| 2012/0001259 A1 | 1/2012 | Chuang et al. |
| 2012/0286375 A1 | 11/2012 | Cai et al. |
| 2013/0037886 A1 | 2/2013 | Tsai et al. |
| 2013/0049069 A1 | 2/2013 | Zhu et al. |
| 2013/0105906 A1 | 5/2013 | Yin et al. |
| 2014/0001543 A1 | 1/2014 | Kim et al. |
| 2014/0042491 A1 | 2/2014 | Chen et al. |
| 2014/0061814 A1 | 3/2014 | Kim et al. |
| 2014/0151814 A1 | 6/2014 | Giles et al. |
| 2014/0242775 A1 | 8/2014 | Lin et al. |
| 2014/0252486 A1 | 9/2014 | Lin et al. |
| 2014/0319623 A1 | 10/2014 | Tsai et al. |
| 2015/0054029 A1 | 2/2015 | Jangjian et al. |
| 2015/0054078 A1 | 2/2015 | Xie et al. |
| 2015/0069524 A1 | 3/2015 | Hong et al. |
| 2015/0118835 A1 | 4/2015 | Lin et al. |
| 2015/0236131 A1 | 8/2015 | Chang et al. |
| 2015/0243563 A1* | 8/2015 | Lee .................. H01L 21/82345 257/392 |
| 2015/0311125 A1 | 10/2015 | Ju et al. |
| 2015/0357468 A1 | 12/2015 | Zhu |
| 2015/0357472 A1 | 12/2015 | Huang et al. |
| 2015/0380305 A1 | 12/2015 | Basker et al. |
| 2015/0380407 A1 | 12/2015 | Ji et al. |
| 2016/0056181 A1 | 2/2016 | Anderson et al. |
| 2016/0133632 A1* | 5/2016 | Park ............... H01L 21/823828 257/369 |

FOREIGN PATENT DOCUMENTS

| | | |
|---|---|---|
| KR | 1020140006204 A | 1/2014 |
| KR | 20140034347 A | 3/2014 |
| KR | 20140111577 A | 9/2014 |
| TW | 201340218 A | 10/2013 |
| TW | 201349310 A | 12/2013 |

\* cited by examiner

STRUCTURE OF SEMICONDUCTOR DEVICE STRUCTURE HAVING FINS

PRIORITY CLAIM AND CROSS-REFERENCE

This application is a continuation of U.S. patent application Ser. No. 15/414,449, filed on Jan. 24, 2017, and entitled "Structure and Formation Method of Semiconductor Device Structure," which application claims the benefit to and is a divisional of U.S. patent application Ser. No. 14/725,555, filed on May 29, 2015 (now U.S. Pat. No. 9,553,090 issued on Jan. 24, 2017), and entitled "Structure and Formation Method of Semiconductor Device Structure," both of which applications are incorporated herein by reference.

This application is related to the co-pending and commonly assigned patent application U.S. patent application Publication Ser. No. 14/725,118, filed on May 29, 2015 and entitled "Structure and formation method of semiconductor device structure", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e. the number of interconnected devices per chip area) has generally increased while geometric size (i.e. the smallest component (or line) that can be created using a fabrication process) has decreased. This scaling down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
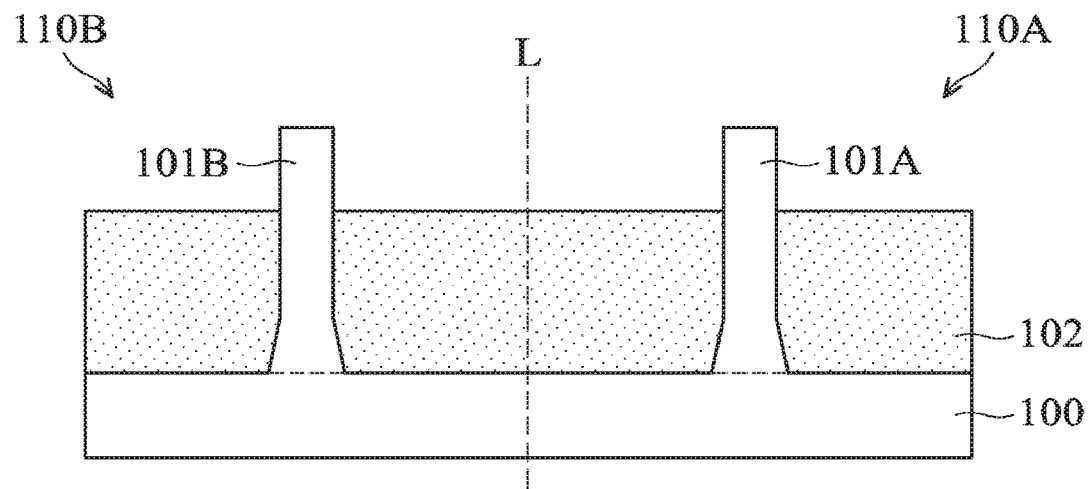
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1I are cross-sectional views of various stages of a process for forming a semiconductor device structure, in accordance with some embodiments. Additional operations can be provided before, during, and/or after the stages described in FIGS. 1A-1I. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, the semiconductor substrate 100 is separated into portions 110A and 110B by an imaginary line L. In some embodiments, two or more transistors are formed in and/or over the portions 110A and 110B of the semiconductor substrate 100. In some embodiments, a p-type metal-oxide-semiconductor field effect transistor (PMOSFET) and an n-type metal-oxide-semiconductor field effect transistor (NMOSFET) will be formed in and/or over the portions 110A and 110B, respectively. In some other embodiments, an NMOSFET and a PMOSFET will be formed in and/or over the portions 110A and 110B, respectively. In some other embodiments, NMOSFETs will be formed in and/or over the portions 110A and 110B. In some other embodiments, PMOSFETs will be formed in and/or over the portions 110A and 110B.

As shown in FIG. 1A, multiple recesses (or trenches) are formed in the semiconductor substrate 100, in accordance with some embodiments. As a result, multiple fin structures including fin structures 101A and 101B are formed between the recesses. In some embodiments, one or more photolithography and etching processes are used to form the recesses.

As shown in FIG. 1A, isolation features 102 are formed in the recesses to surround lower portions of the fin structures 101A and 101B, in accordance with some embodiments. The isolation features 102 are used to define and electrically isolate various device elements formed in and/or over the semiconductor substrate 100. In some embodiments, the isolation features 102 include shallow trench isolation (STI) features, local oxidation of silicon (LOCOS) features, another suitable isolation feature, or a combination thereof.

In some embodiments, each of the isolation features 102 has a multi-layer structure. In some embodiments, the isolation features 102 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features 102. Similarly, the STI liner may also be used to reduce crystalline defects at the interface between the fin structures and the isolation features 102.

In some embodiments, a dielectric material layer is deposited over the semiconductor substrate 100. The dielectric material layer covers the fin structures including the fin structures 101A and 101B and fills the recesses between the fin structures. In some embodiments, the dielectric material layer is deposited using a chemical vapor deposition (CVD) process, a spin-on process, another applicable process, or a combination thereof. In some embodiments, a planarization process is performed to thin down the dielectric material layer until the fin structures 101A and 101B are exposed. The planarization process may include a chemical mechanical polishing (CMP) process, a grinding process, an etching process, another applicable process, or a combination thereof. Afterwards, the dielectric material layer is etched back to form the isolation features 102. The fin structures including the fin structures 101A and 101B protrude from the isolation features 102, as shown in FIG. 1A in accordance with some embodiments.

Figure 1B:
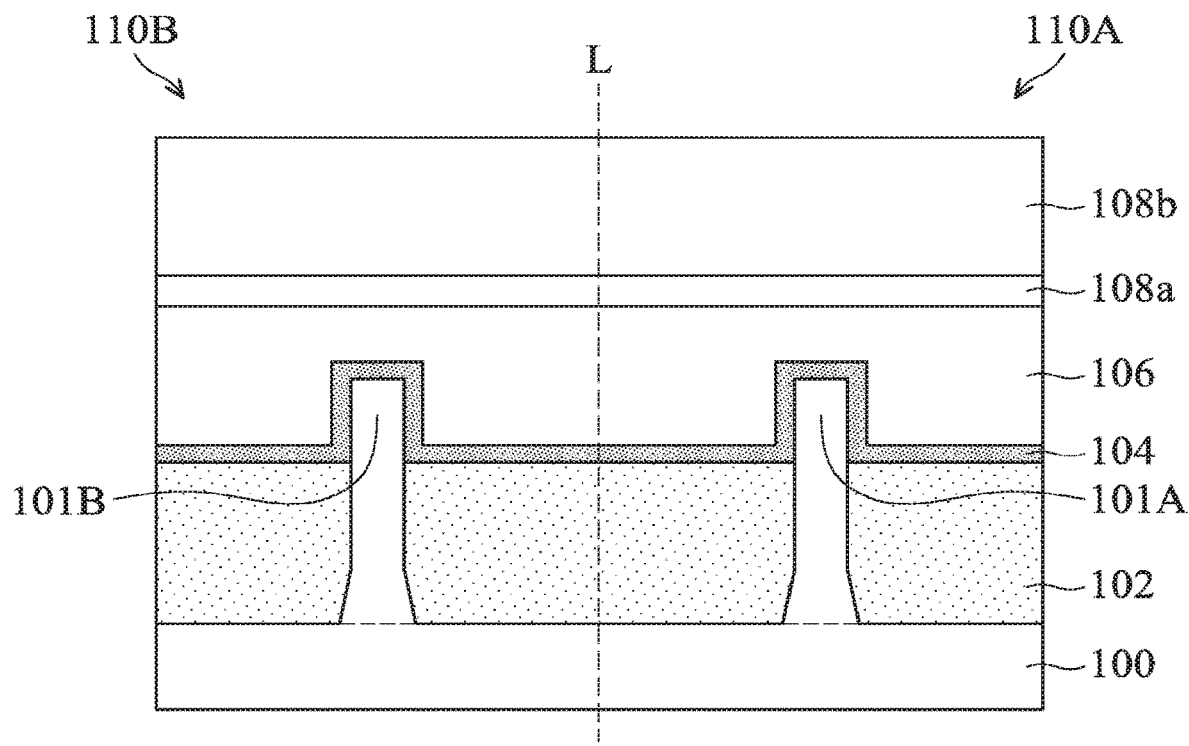

As shown in FIG. 1B, a gate dielectric layer 104 and a dummy gate electrode layer 106 are deposited over the isolation features 102 and the fin structures 101A and 101B, in accordance with some embodiments. In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will be removed subsequently. The dummy gate dielectric layer is, for example, a silicon oxide layer.

In some embodiments, the gate dielectric layer 104 is deposited using a chemical vapor deposition (CVD) process, an atomic layer deposition (ALD) process, a thermal oxidation process, a physical vapor deposition (PVD) process, another applicable process, or a combination thereof. In some embodiments, the dummy gate electrode layer 106 is made of polysilicon. For example, the dummy gate electrode layer 106 is deposited using a CVD process or another applicable process. Many variations and/or modifications can be made to embodiments of the disclosure. In some embodiments, the gate dielectric layer 104 is not formed.

Afterwards, a patterned hard mask layer is formed over the dummy gate electrode layer 106, as shown in FIG. 1B in accordance with some embodiments. The patterned hard mask layer is used to pattern the dummy gate electrode layer 106 and the gate dielectric layer 104 into one or more dummy gate stacks (or dummy gate lines). In some embodiments, the patterned hard mask includes a first hard mask layer 108a and a second hard mask layer 108b. In some embodiments, the first hard mask layer 108a is made of silicon nitride. In some embodiments, the second hard mask layer 108b is made of silicon oxide. In some embodiments, the second hard mask layer 108b is thicker than the first mask layer 108a.

In some embodiments, the dummy gate stacks are multiple dummy gate lines formed over the isolation features 102 and the fin structures 101A and 101B. In some embodiments, the dummy gate lines are substantially parallel to each other. In some embodiments, each of the dummy gate stacks (or dummy gate lines) is formed into two or more gate stacks of different transistors in subsequent processes.

In some embodiments, a patterned photoresist layer (not shown) is used to assist in the formation of the patterned hard mask layer. The patterned photoresist layer is formed using a photolithography process. The photolithography process may include photoresist coating (e.g., spin-on coating), soft baking, mask aligning, exposure, post-exposure baking, developing the photoresist, rinsing, drying (e.g., hard baking), another suitable process, or a combination thereof.

Figure 1C:
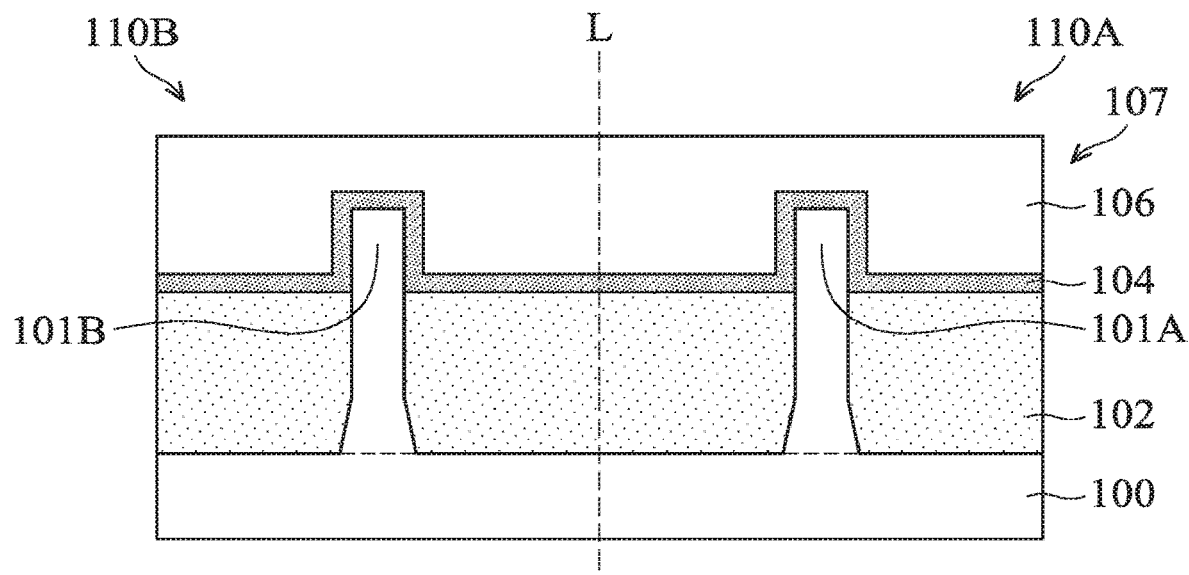
Figure 2A:
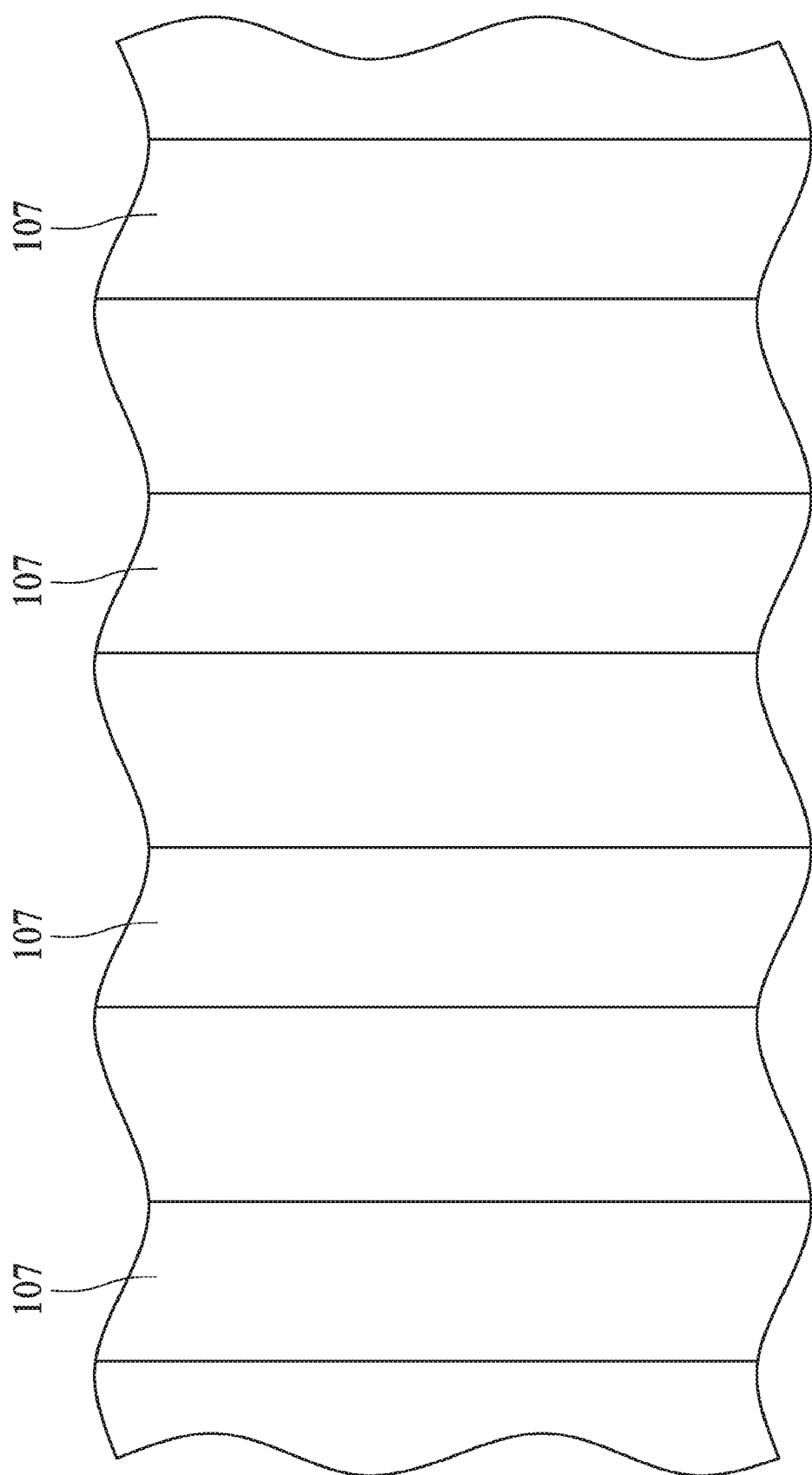
FIGS. 2A-2G are top views of various stages of a process for forming a semiconductor device structure, in accordance with some embodiments.

Afterwards, the dummy gate electrode layer 106 and the gate dielectric layer 104 are patterned to form one or more dummy gate stacks 107, as shown in FIG. 1C in accordance with some embodiments. In some embodiments, the hard mask layers 108a and 108b are removed afterwards. FIGS. 2A-2G are top views of various stages of a process for forming a semiconductor device structure, in accordance with some embodiments. In some embodiments, FIG. 2A is a top view of the structure shown in FIG. 1C. As shown in FIGS. 1C and 2A, multiple dummy gate stacks 107 are formed, in accordance with some embodiments. For brevity, only the dummy gate stacks 107 (or dummy gate lines) are shown in FIG. 2A. Each of the dummy gate stacks 107 includes the dummy gate electrode layer 106 and the gate dielectric layer 104. In FIGS. 1C and 2B-2G, only one of the dummy gate stacks 107 is shown for the sake of brevity.

Afterwards, source/drain structures are formed over the fin structures 101A and 101B and adjacent to the dummy gate stack 107, in accordance with some embodiments. FIGS. 3A-3D are cross-sectional views of various stages of a process for forming a semiconductor device structure, in accordance with some embodiments. In some embodiments, FIGS. 1C-1I are cross-sectional views taken along the line I-I of FIGS. 2B-2G. In some embodiments, FIGS. 3A-3C are cross-sectional views taken along the line J-J of FIGS. 2C-2G, and FIG. 3D is a cross-sectional view taken along the line K-K of FIG. 2G.

Figure 2C:
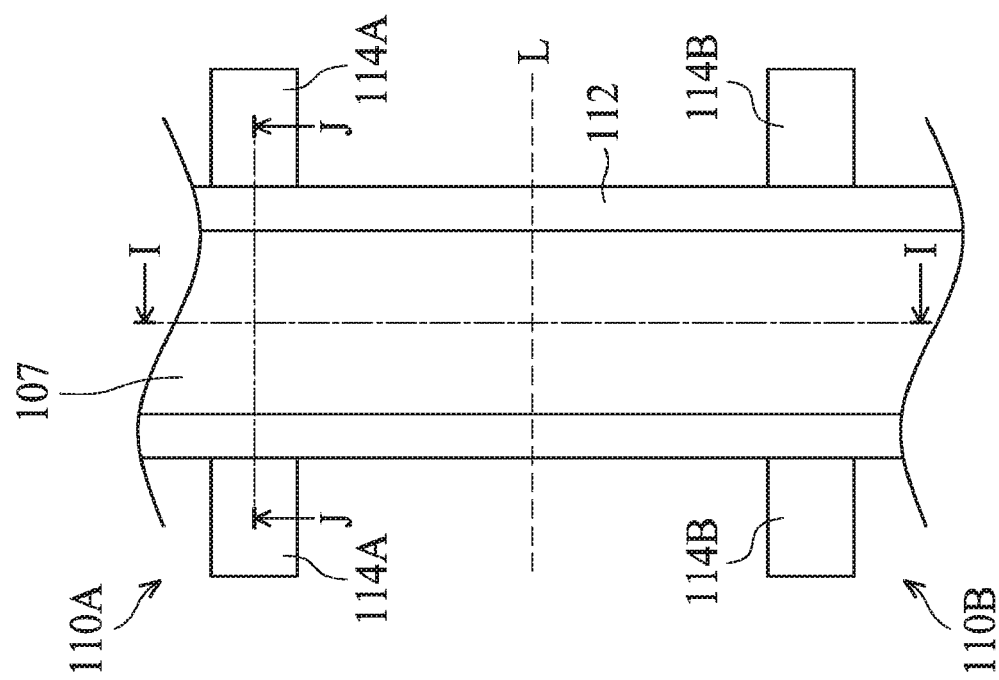
Figure 2B:
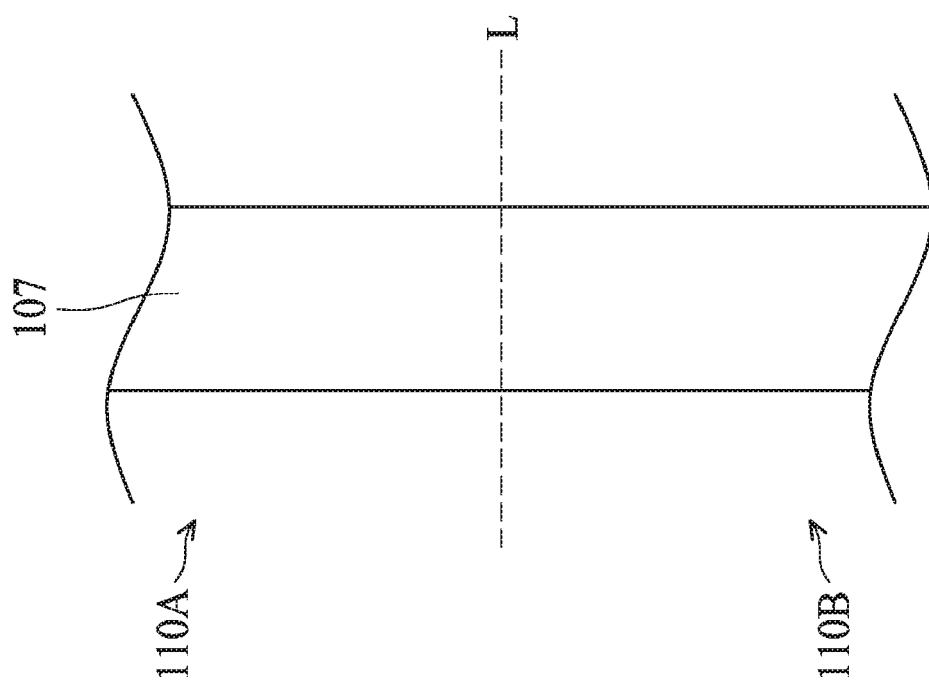
Figure 2E:
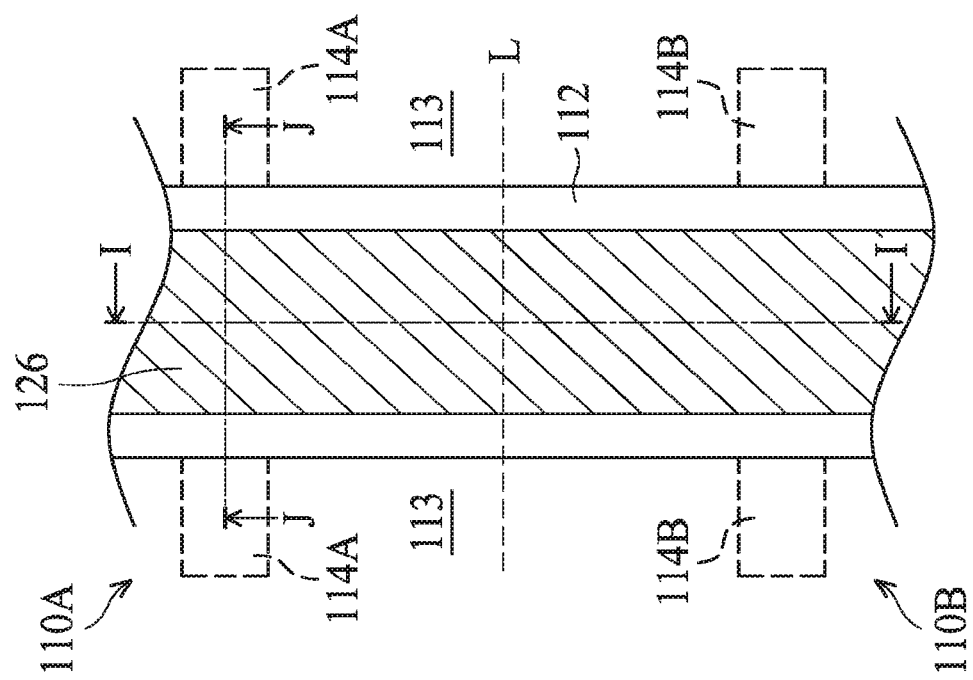
Figure 3A:
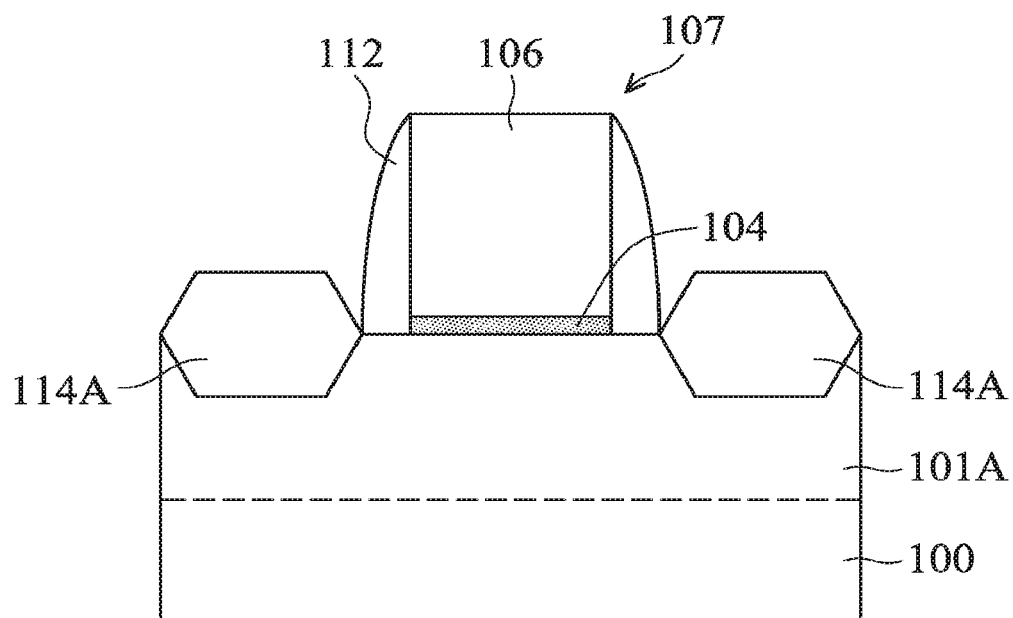
FIGS. 3A-3D are cross-sectional views of various stages of a process for forming a semiconductor device structure, in accordance with some embodiments.
Figure 3B:
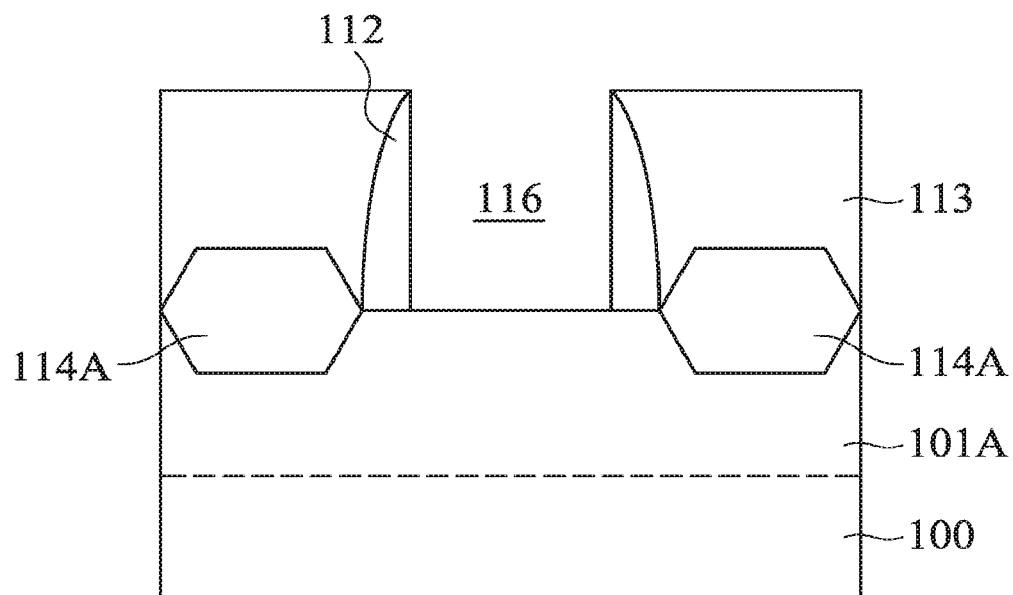
Figure 3C:
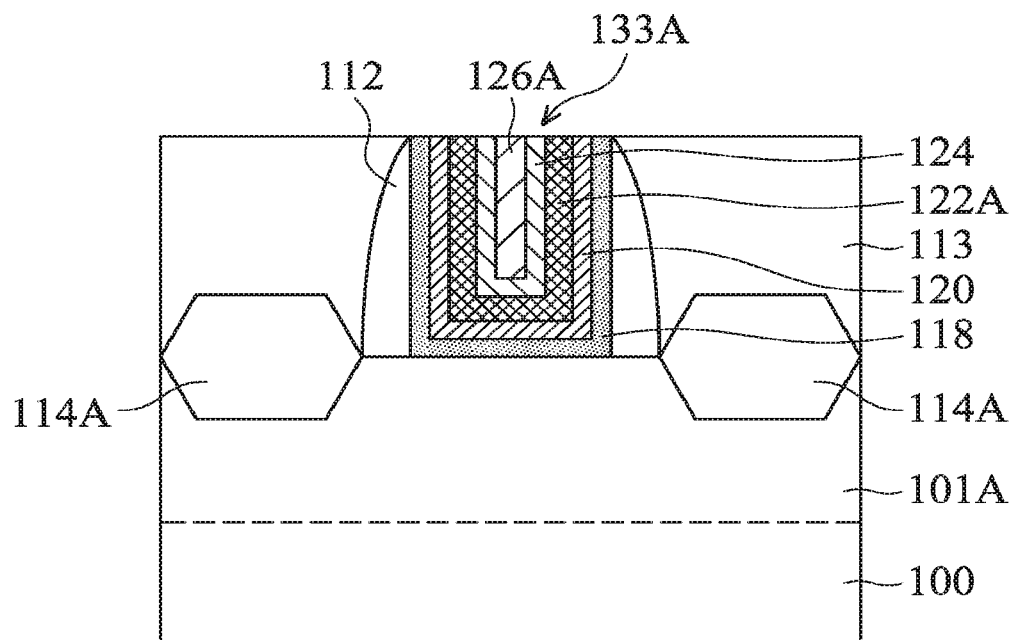

Referring to FIGS. 2C and 3A, source/drain structures 114A and 114B are formed over the semiconductor substrate 100 and between the dummy gate stack 107, in accordance with some embodiments. As mentioned above, in some embodiments, two transistors are formed in and/or over the portions 110A and 110B of the semiconductor substrate 100. The source/drain structures 114A are a portion of the transistor formed in and/or over the portion 110A, and the source/drain region 114B are a portion of another transistor formed in and/or over the portion 110B.

In some embodiments, the fin structures 101A and 101B are recessed to be lower than top surfaces of the isolation features 102, in accordance with some embodiments. In some embodiments, an etching process is performed to remove upper portions of the fin structures 101A and 101B. As a result, recesses are formed above the fin structures 101A (and 101B), as shown in FIG. 3A. In some other embodiments, multiple etching operations are used so that the recesses further extend laterally towards channel regions below the dummy gate stack 107.

In some embodiments, a semiconductor material (or two or more semiconductor materials) is epitaxially grown over the fin structures that are recessed, growing continually to above the recesses, to form the source/drain structures 114A and 114B. In some embodiments, the growth of the source/drain structures 114A and 114B are performed simultaneously. In some embodiments, the growth of the source/drain structures 114A and 114B are performed separately in different processes.

In some embodiments, the source/drain structures 114A are a p-type semiconductor material. For example, the source/drain structures 114A may include epitaxially grown silicon germanium. The source/drain structures 114A are not limited to being a p-type semiconductor material. In some embodiments, the source/drain structures 114A are an n-type semiconductor material. The source/drain structures 114A may include epitaxially grown silicon, epitaxially grown silicon carbide (SiC), epitaxially grown silicon phosphide (SiP), or another suitable epitaxially grown semiconductor material.

In some embodiments, both of the source/drain structures 114A and 114B are p-type. In some embodiments, both of the source/drain structures 114A and 114B are n-type. In some embodiments, one of the source/drain structures 114A and 114B is p-type, and the other of the source/drain structures 114A and 114B is n-type.

In some embodiments, the source/drain structures 114A and 114B are formed using a selective epitaxy growth (SEG) process, a CVD process (e.g. a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the source/drain structures 114A and 114B may use gaseous and/or liquid precursors. In some embodiments, both the source/drain structures 114A and 114B are grown in-situ in the same process chamber. In other words, the source/drain structures 114A and 114B are formed using an in-situ epitaxial growth process. In some other embodiments, the source/drain structures 114A and 114B are grown separately.

The source/drain structures 114A and 114B include dopants. In some embodiments, multiple implantation processes are performed to dope the source/drain structures 114A and 114B. In some embodiments, spacer elements 112 are formed over sidewalls of the dummy gate stack 107 to assist in the formation of the source/drain structures 114A and 114B, as shown in FIGS. 2C and 3A. In some embodiments, light doped source/drain regions (not shown) are formed using ion implantation processes before the spacer elements 112 are formed.

In some embodiments, the source/drain structures 114A and 114B are doped in-situ during the growth of the source/drain structures 114A and 114B. In some other embodiments, the source/drain structures 114A and 114B are not doped during the growth of the source/drain structures 114A and 114B. After the epitaxial growth, the source/drain structures 114A and 114B are doped in a subsequent process. In some embodiments, the doping is achieved using an ion implantation process, a plasma immersion ion implantation process, a gas and/or solid source diffusion process, another applicable process, or a combination thereof. In some embodiments, the source/drain structures 114A and 114B are further exposed to annealing processes to activate the dopants. For example, a rapid thermal annealing process is performed.

Figure 1D:
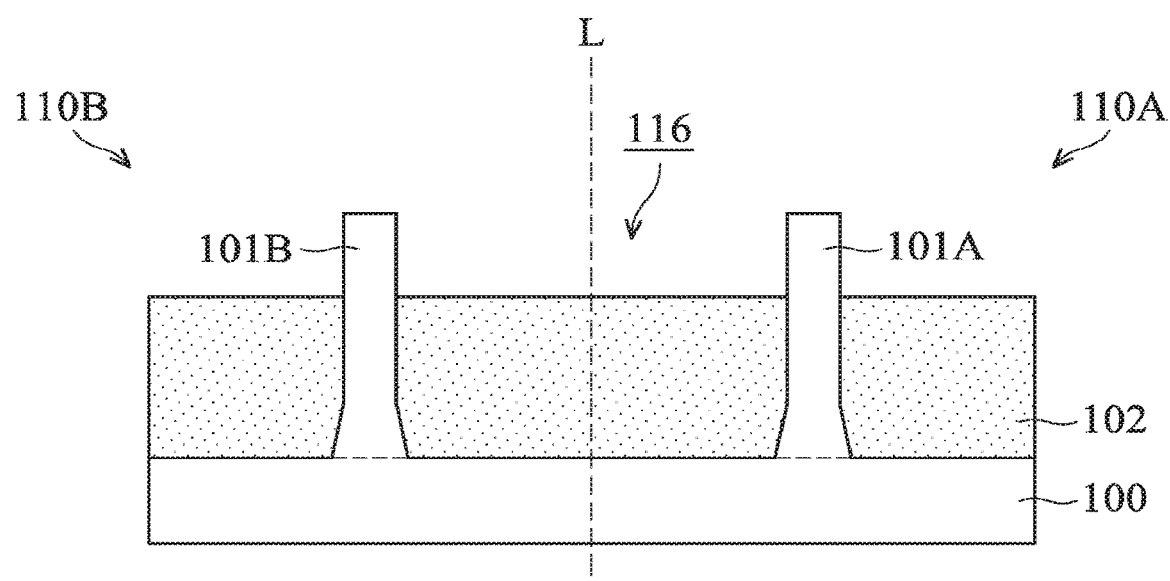
Figure 2D:
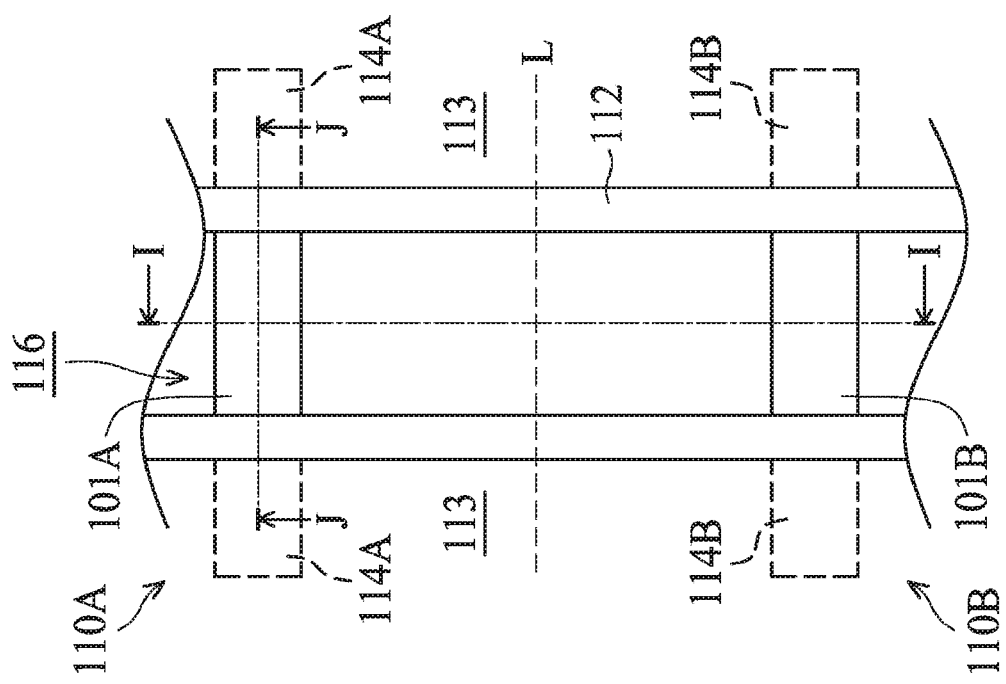

As shown in FIGS. 1D, 2D, and 3B, the dummy gate stacks 107 are removed, in accordance with some embodiments. In some embodiments, before the removal of the dummy gate stacks 107, a dielectric layer 113 is deposited over the source/drain structures 114A and 114B and the dummy gate stacks 107, as shown in FIG. 2D and 3B. In some embodiments, the dielectric layer 113 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable dielectric material, or a combination thereof. In some embodiments, the dielectric layer 113 is deposited using a CVD process, a spin-on process, an ALD process, a PVD process, another applicable process, or a combination thereof.

Afterwards, the dielectric layer 113 is thinned down until the dummy gate electrode layer 106 is exposed. The thinned dielectric layer 113 surrounds the dummy gate stacks 107. In some embodiments, the dielectric layer 113 is thinned down using a planarization process. The planarization process may include a chemical mechanical polishing (CMP) process, a grinding process, an etching process, another applicable process, or a combination thereof. Many variations and/or modifications can be made to embodiments of the disclosure. In some other embodiments, the dielectric layer 113 is not formed.

Afterwards, the dummy gate stacks 107 are removed to form a trench 116 over the fin structures 101A and 101B and the isolation features 102, as shown in FIGS. 1D, 2D, and 3B in accordance with some embodiments. In some embodiments, the dielectric layer 113 is formed, and the trench 116 is formed in the dielectric layer 113. In other words, the dielectric layer 113 surrounds the trench 116. In some embodiments, the trench 116 is between the spacer elements 112. In some embodiments, the trench 116 exposes the portions of the fin structures 101A and 101B that are originally covered by the dummy gate stacks 107, as shown in FIGS. 1D, 2D, and 3B. The exposed portions of fin structures 101A and 101B may serve as channel regions. In some embodiments, the dummy gate stack 107 is removed using a dry etching process, a wet etching process, another applicable process, or a combination thereof. In some embodiments, the gate dielectric layer 104 is made of a high-K material and is not removed. In these cases, the trench 116 exposes the gate dielectric layer 104.

Figure 1E:
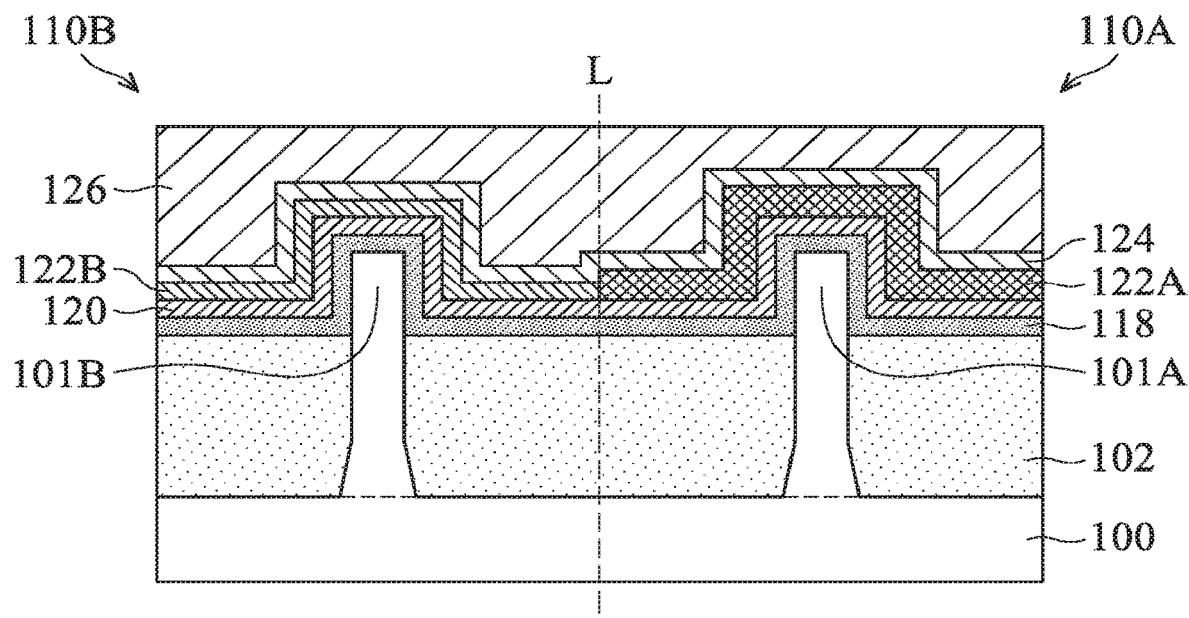

After the removal of the dummy gate stacks 107, metal gate stack layers are deposited over the sidewalls and bottom of the trench 116, as shown in FIGS. 1E, 2E, 3C, and 3D in accordance with some embodiments. The metal gate stack layers extend along sidewalls and tops of the fin structures 101A and 101B, as shown in FIG. 1E. The metal gate stack layers in the trench 116 may also be called a metal gate stack line.

As mentioned above, in some embodiments, each of the dummy gate stacks 107 (or dummy gate lines) will be formed into two or more gate stacks of different transistors. Therefore, the trench 116 formed after the removal of the dummy gate stack 107 is long enough to contain two or more metal gate stacks of transistors. The depositions or fillings of the metal gate stack layers are easier than other cases where the depositions or fillings of the metal gate stack layers are performed in a recess designed to contain only one metal gate stack of a transistor. As a result, the process window is enlarged significantly.

In some embodiments, the metal gate stack layers include a gate dielectric layer, a work function layer, and a metal filling layer. In some embodiments, two transistors are formed in and/or over the portions 110A and 110B of the semiconductor substrate 100. In some embodiments, one of the transistors is a p-type transistor, and the other one is an n-type transistor. In some embodiments, both of the transistors are p-type transistors. In some embodiments, both of the transistors are n-type transistors. In some embodiments, one or more p-type work function layers are formed over the portion 110A, and one or more n-type work function layers are formed over the portion 110B. In some embodiments, one or more n-type work function layers are formed over the portion 110A, and one or more p-type work function layers are formed over the portion 110B.

Figure 3D:
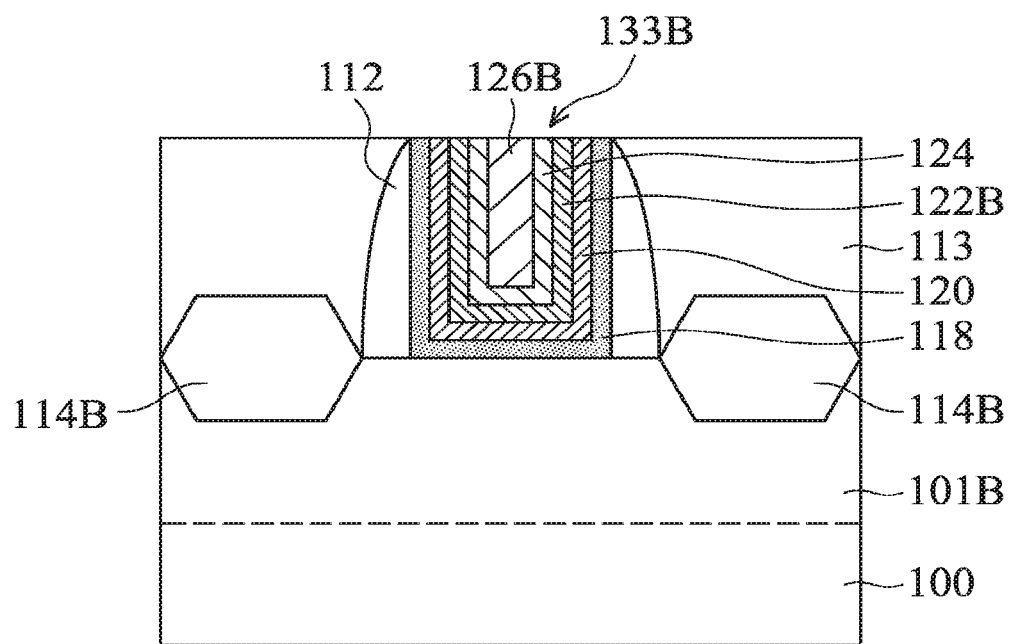

As shown in FIGS. 1E, 3C, and 3D, a gate dielectric layer 118 is deposited over the sidewalls and bottom of the trench 116, in accordance with some embodiments. In some embodiments, the gate dielectric layer 118 extends over both of the portions 110A and 110B. In some embodiments, the gate dielectric layer 118 is a high-k dielectric layer. The high-k dielectric layer may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the gate dielectric layer 118 is deposited using an ALD process, a CVD process, a spin-on process, another applicable process, or a combination thereof. In some embodiments, a high temperature annealing operation is performed to reduce or eliminate defects in the gate dielectric layer 118. Many variations and/or modifications can be made to embodiments of the disclosure. In some embodiments, two different gate dielectric layers are formed over the portions 110A and 110B to serve as the gate dielectric layers of different transistors.

In some other embodiments, before the gate dielectric layer 118 is formed, an interfacial layer (not shown) is formed in the trench 116. The interfacial layer may be used to reduce stress between the gate dielectric layer 118 and the fin structures 101A and 101B. In some embodiments, the interfacial layer is made of silicon oxide. In some embodiments, the interfacial layer is formed using an ALD process, a thermal oxidation process, another applicable process, or a combination thereof.

As shown in FIGS. 1E, 3C, and 3D, a barrier layer 120 is deposited over the gate dielectric layer 118, in accordance with some embodiments. The barrier layer 120 may be used to interface the gate dielectric layer 118 with subsequently formed work function layers. The barrier layer 120 may also be used to prevent diffusion between the gate dielectric layer 118 and the subsequently formed work function layers.

In some embodiments, the barrier layer 120 is made of a metal-containing material. The metal-containing material may include titanium nitride, tantalum nitride, another suitable material, or a combination thereof. In some embodiments, the barrier layer 120 includes multiple layers. In some embodiments, the barrier layer 120 is deposited using an ALD process, a PVD process, an electroplating process, an electroless plating process, a CVD process, another applicable process, or a combination thereof. In some other embodiments, the barrier layer 120 is not formed. In some embodiments, two different barrier layers are formed over the portions 110A and 110B to serve as the barrier layers of different transistors.

Afterwards, work function layers 122A and 122B are formed over the barrier layer 120, as shown in FIGS. 1E, 3C, and 3D in accordance with some embodiments. The work function layer is used to provide desired work function for transistors to enhance device performance including improved threshold voltage. In the embodiments of forming an NMOS transistor, the work function layer can be an n-type metal layer. The n-type metal layer is capable of providing a work function value suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, another suitable material, or a combination thereof.

On the other hand, in the embodiments of forming a PMOS transistor, the work function layer can be a p-type metal layer. The p-type metal layer is capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer may also be made of hafnium, zirconium, titanium, tantalum, aluminum, metal carbides (e.g. hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level. For example, a titanium nitride layer may be used as a p-type metal layer or an n-type metal layer, depending on the thickness and/or the compositions of the titanium nitride layer.

In some embodiments, the work function layer 122A is a p-type metal layer, and the work function layer 122B is an n-type metal layer. In some embodiments, the work function layer 122A is formed before the work function layer 122B. The work function layer 122A is deposited over the barrier layer 120. Afterwards, the work function layer 122A is patterned. For example, the work function layer 122A is positioned over the portion 110A of the semiconductor substrate 100. The portion of the work function layer 122A originally over the portion 110B is removed. For example, a photolithography process and an etching process are used to pattern the work function layer 122A. Similarly, the work function layer 122B is deposited and patterned over the portion 110B of the semiconductor substrate 100.

Many variations and/or modifications can be made to embodiments of the disclosure. In some other embodiments, the work function layer 122B is formed before the work function layer 122A. In some other embodiments, both of the work function layers 122A and 122B have the same conductivity type, such as n-type or p-type.

Afterwards, a blocking layer 124 is deposited over the work function layers 122A and 122B, as shown in FIGS. 1E, 3C, and 3D in accordance with some embodiments. The blocking layer 124 may be used to prevent a subsequently formed metal filling layer from diffusing or penetrating into the work function layers. In some embodiments, the blocking layer 124 is made of tantalum nitride, titanium nitride, another suitable material, or a combination thereof. In some embodiments, the blocking layer 124 is deposited using an ALD process, a PVD process, an electroplating process, an electroless plating process, another applicable process, or a combination thereof.

Embodiments of the disclosure are not limited thereto. In some other embodiments, the blocking layer 124 is not formed. In some other embodiments, two different blocking layers are used between the subsequently formed metal filing layers and the different work function layers 122A and 122B.

Afterwards, a metal filling layer 126 is deposited over the blocking layer 124 to fill the trench 116, as shown in FIGS. 1E, 2E, 3C, and 3D in accordance with some embodiments. In some embodiments, the metal filling layer 126 is made of tungsten, aluminum, copper, cobalt, another suitable material, or a combination thereof. In some embodiments, the metal filling layer 126 is deposited using a PVD process, a CVD process, an electroplating process, an electroless plating process, another applicable process, or a combination thereof. In some other embodiments, the metal filling layer 126 is not formed. In some other embodiments, two different metal filling layers are formed over the portions 110A and 110B to serve as the metal filing layers of different transistors.

In some embodiments, a first set of metal gate stack layers are formed over the portion 110A, and the portion 110B is blocked by, for example, a patterned mask. Afterwards, a second set of metal gate stack layers are formed over the portion 110B, and the first set of metal gate stack layers are covered by another patterned mask.

In some embodiments, the metal gate stack layers, including the gate dielectric layer 118, the barrier layer 120, the work function layers 122A and 122B, the blocking layer 124, and the metal filling layer 126, together fill the trench 116 and cover the dielectric layer 113. In some embodiments, the portion of the metal gate stack layers outside of the trench 116 is removed. For example, a planarization process is used to partially remove the metal gate stack layers until the dielectric layer 113 is exposed. The planarization process may include a CMP process, a grinding process, an etching process, another applicable process, or a combination thereof.

Figure 1F:
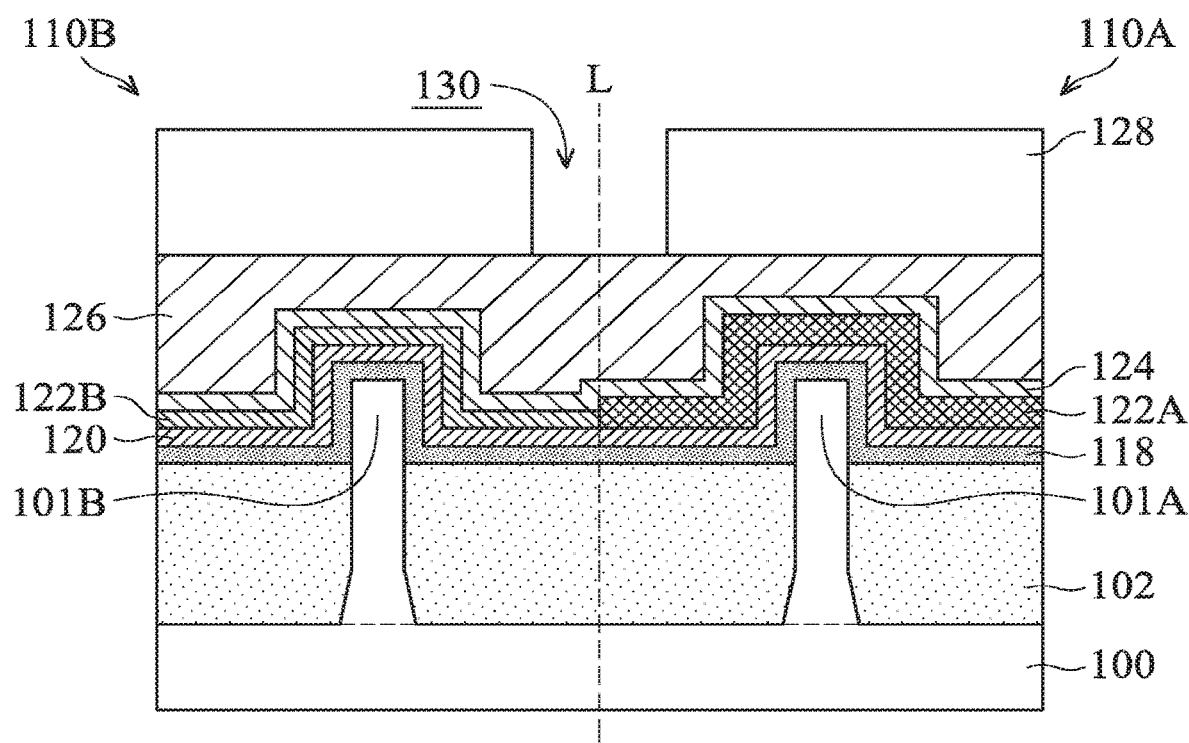

After the formation of the metal gate stack layers in the trench 116, the metal gate stack layers are patterned to form multiple metal gate stacks, in accordance with some embodiments. As shown in FIG. 1F, a mask layer 128 is deposited and patterned over the metal filling layer 126 to assist in the patterning of the metal gate stack layers, in accordance with some embodiments. In some embodiments, the mask layer 128 is made of a photoresist material, silicon nitride, silicon oxynitride, silicon oxide, titanium nitride, another suitable material, or a combination thereof. The mask layer 128 may be deposited using a spin-on process, a CVD process, another applicable process, or a combination thereof. A photolithography process and an etching process may be used to pattern the mask layer 128. In some embodiments, the mask layer 128 has an opening 130 which exposes a portion of the metal filling layer 126, as shown in FIG. 1F. The imaginary line L separating the semiconductor substrate 100 into the portions 110A and 11 OB may pass through the opening 130.

Figure 1G:
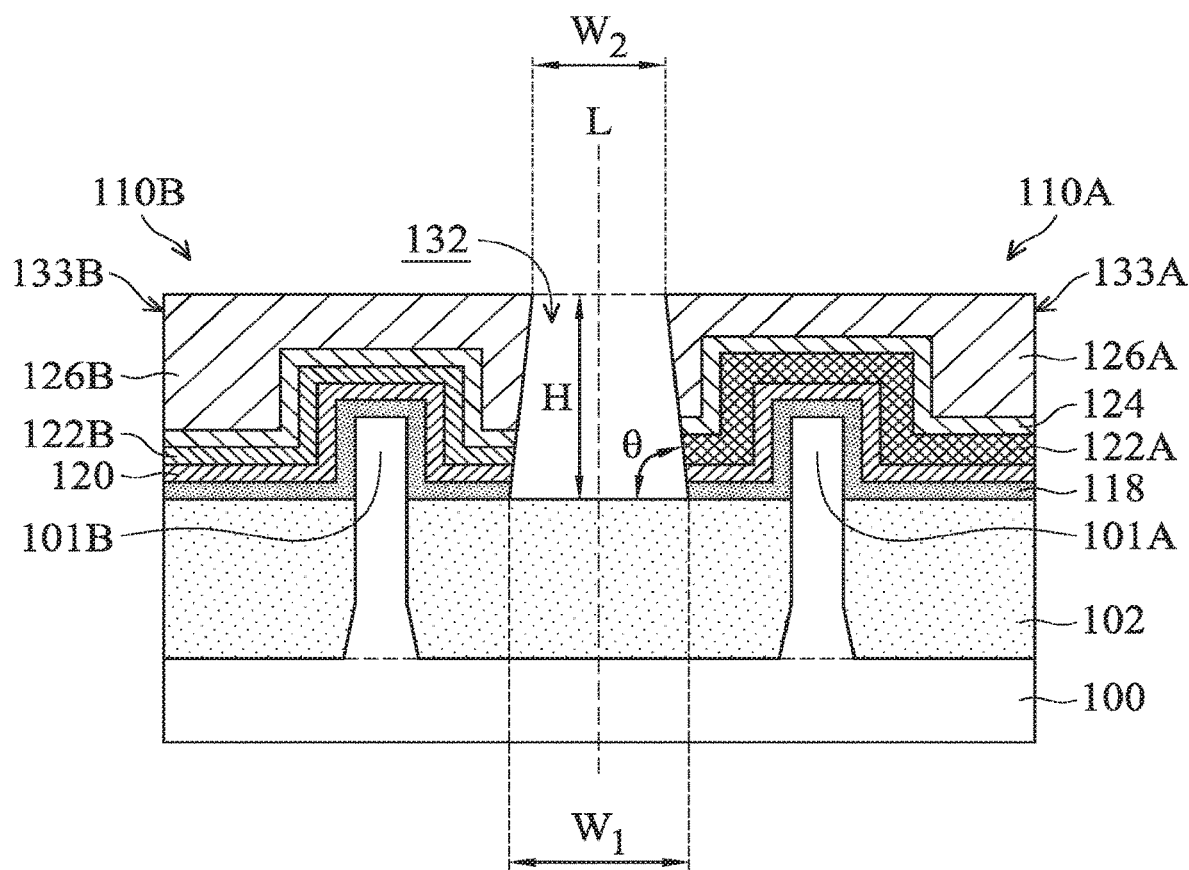
Figure 2G:
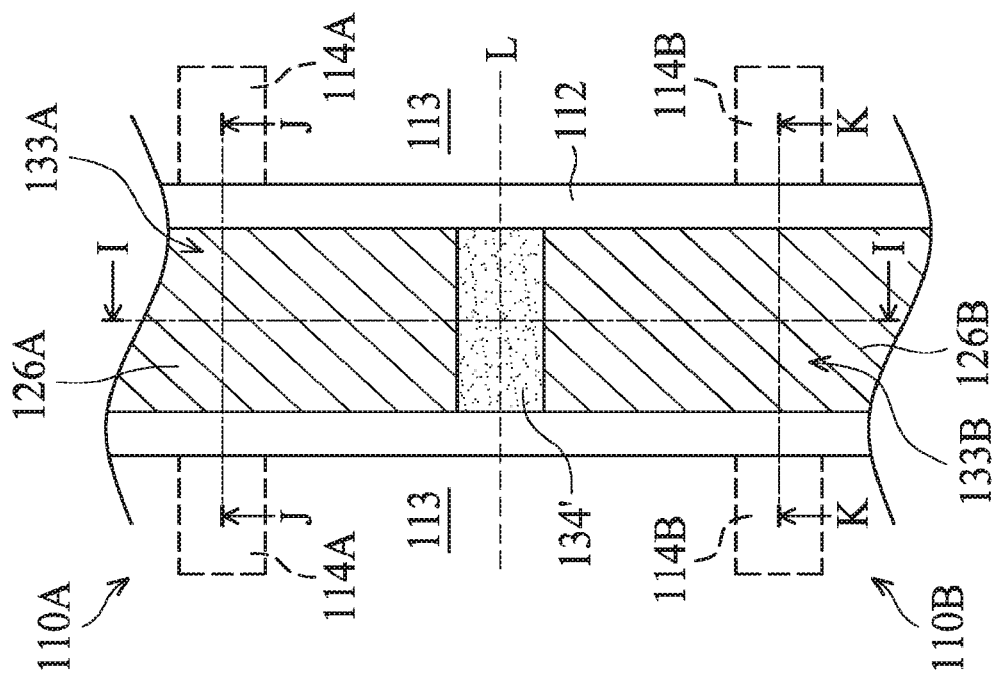
Figure 2F:
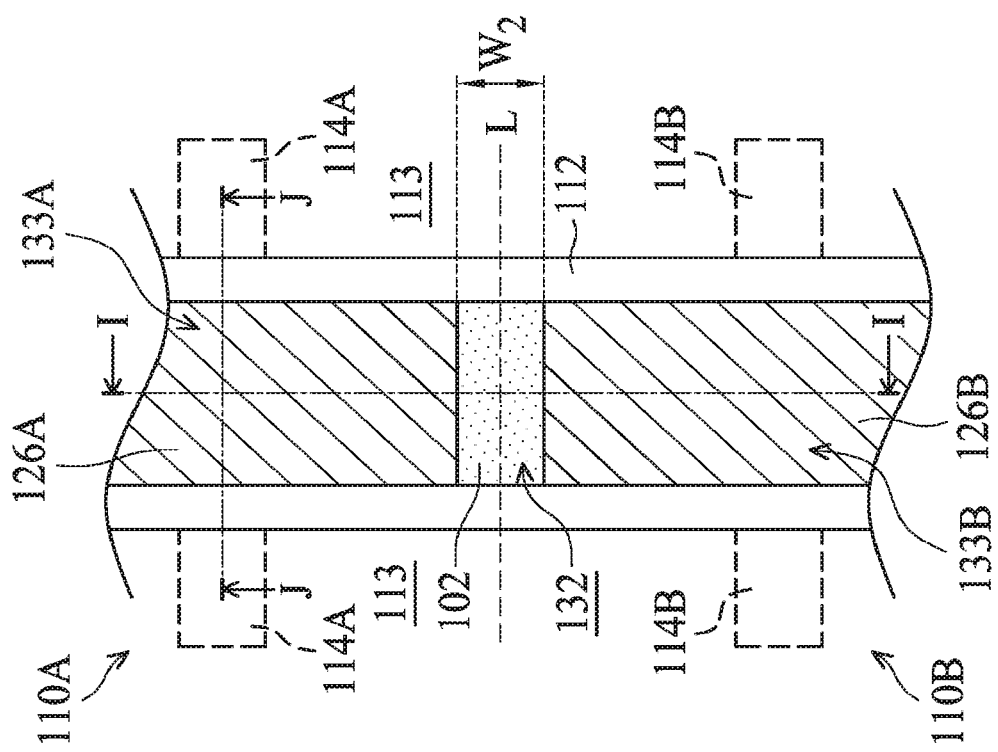

Referring to FIGS. 1G and 2F, a portion of the metal gate stack layers is removed to form one or more recesses 132 in the metal gate stack layers, in accordance with some embodiments. The mask layer 128 is used to assist in the formation of the recess 132. In some embodiments, the mask layer 128 is removed after the formation of the recess 132. The recess 132 separates the metal gate stack layers into two or more gate stacks including the gate stacks 133A and 133B, as shown in FIGS. 1G and 2F in accordance with some embodiments. In some embodiments, the gate stacks 133A and 133B are not in direct contact with each other. As shown in FIGS. 1G and 2F, the recess 132 exposes the isolation feature 102, in accordance with some embodiments.

In some embodiments, the metal filling layer 126 is divided into multiple portions including metal fillings 126A and 126B, as shown in FIGS. 1G, 2F, 3C, and 3D. In these cases, the materials of the metal fillings 126A and 126B are the same. In some other embodiments, the metal fillings 126A and 126B have different materials. In these cases, two different metal filling layers are deposited and patterned to form the metal fillings 126A and 126B. In some embodiments, the gate dielectric layers of the gate stacks 133A and 133B are portions of the gate dielectric layer 118. In these cases, the gate dielectric layers of the gate stacks 133A and 133B have the same material.

The formation of the recess 132 may also be called an end cut process. The end cut process cuts "the metal gate stack line" (or the metal gate stack layers) into multiple separate metal gate stacks. The end cut process is performed after the deposition of the metal gate stack layers. The metal gate stack layers are deposited in the trench 116 which is large enough to contain two or more gate stacks and has a relatively low aspect ratio. Therefore, the depositions of the metal gate stack layers could be performed well. The quality and the reliability of the metal gate stack layers are improved significantly. The size, the profile, and the position of the recess 132 may be controlled more precisely. As a result, problems such as short circuiting or current leakage are reduced or prevented.

As shown in FIG. 1G, the recess 132 has an upper width $W_2$, a lower width W1, and a height H. In some embodiments, the width $W_1$ is wider than the width $W_2$. In some embodiments, because the width $W_2$ is smaller than the width $W_1$, the portions of the metal gate stack layers over the fin structures are prevented from being damaged during the formation of the recess 132. In some embodiments, the width $W_1$ is in a range from about 15 nm to about 1000 nm. In some embodiments, the width $W_2$ is in a range from about 10 nm to about 500 nm. In some embodiments, the height H is in a range from about 50 nm to about 2000 nm. However, embodiments of the disclosure are not limited thereto. In some other embodiments, the width $W_2$ is wider than the width $W_1$. In some embodiments, the width $W_1$ is substantially equal to the width $W_2$.

By varying the etching conditions for forming the recess 132, the profile of the recess 132 can be fine-tuned. For example, an angle θ between a sidewall and a bottom of the recess 132 may be tuned by varying the etching conditions. In some embodiments, the angle θ is in a range from about 10 degrees to about 85 degrees. In some other embodiments, the angle θ is in a range from about 20 degrees to about 75 degrees. In some cases, the angle θ should be greater than about 10 degrees to ensure that the width W2 is not too small to negatively affect a subsequent filing process. In some cases, the angle θ should be smaller than about 85 degrees to ensure that the portions of the metal gate stack layers over the fin structures are not damaged during the formation of the recess 132.

In some embodiments, multiple etching operations are used to form the recess 132 since the formation of the recess 132 involves etching different material layers. In some embodiments, the etchant used in the etching operations includes a gas mixture. The gas mixture may include $Cl_2$, HBr, $BCl_3$, $NF_3$, $N_2$, $CF_4$, $CH_2F_2$, $O_2$, Ar, $N_2H_2$, $CH_4$, $SF_6$, another suitable gas, or a combination thereof. During the etching operations, the composition of the gas mixture may be varied according to the requirements. In some embodiments, the pressure used for performing the etching operations is in a range from about 1 mTorrs to about 80 mTorrs. In some embodiments, the operation power used for performing the etching operations is in a range from about 100 W to about 1500 W. In some embodiments, the operation temperature for performing the etching operations is in a range from about 10 degrees C. to about 50 degrees C. In some embodiments, the operation time for performing the etching operations is in a range from about 5 seconds to about 600 seconds.

Figure 1H:
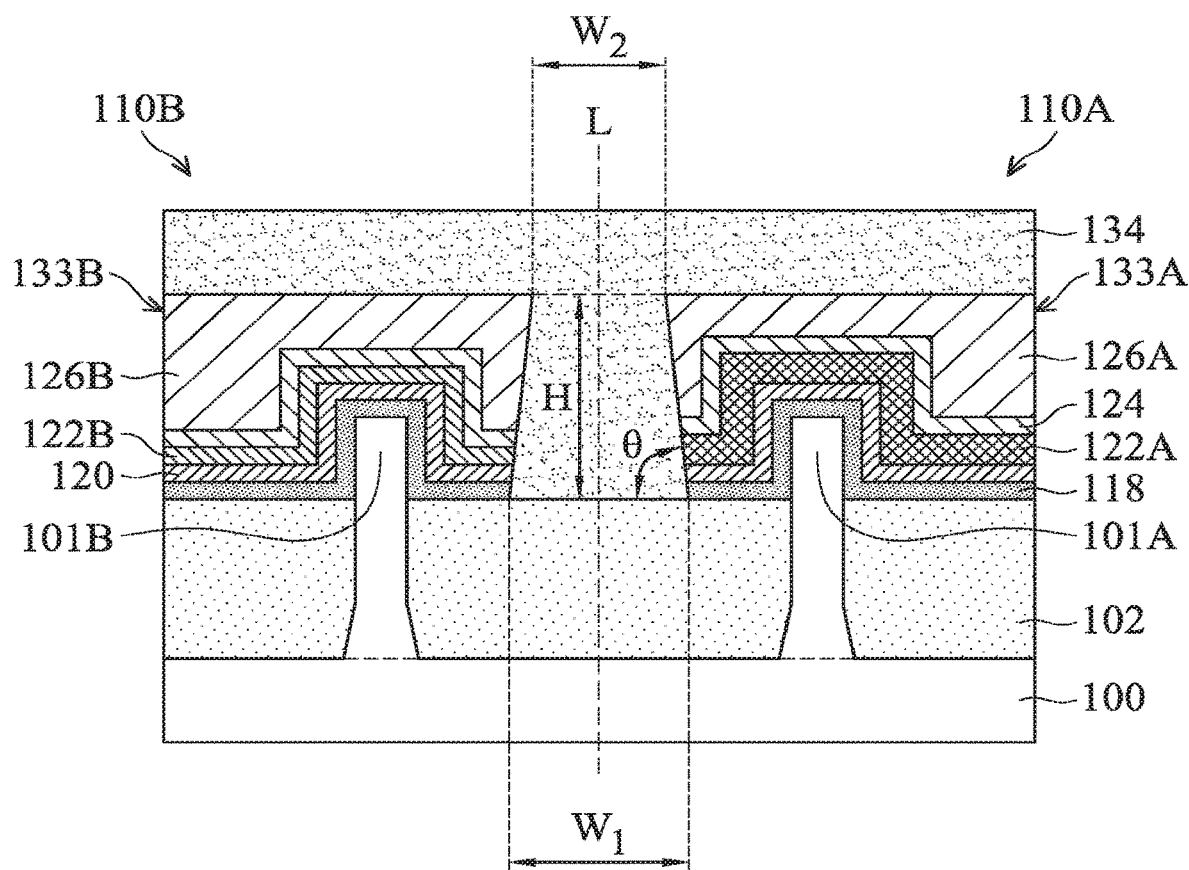

Referring to FIG. 1H, a dielectric layer 134 is formed over the gate stacks 133A and 133B (and the dielectric layer 113) to fill the recess 132, in accordance with some embodiments. In some embodiments, the dielectric layer 134 is made of silicon oxide, silicon nitride, silicon oxynitride, carbon-containing silicon oxide, another suitable dielectric material, or a combination thereof. In some embodiments, the material of the dielectric layer 134 is different from that of the dielectric layer 113 which surrounds the gate stacks 133A and 133B. However, embodiments of the disclosure are not limited thereto. In some embodiments, the materials of the dielectric layer 134 and the dielectric layer 113 are substantially the same.

In some embodiments, the dielectric layer 134 is formed using a deposition process suitable for filling a recess or an opening having a high aspect ratio or having a smaller upper width. In some embodiments, the dielectric layer 134 is deposited using an ALD process, a flowable chemical vapor deposition (FCVD) process, another applicable process, or a combination thereof. In some other embodiments, a spin-on process is used to form the dielectric layer 134.

Figure 1I:
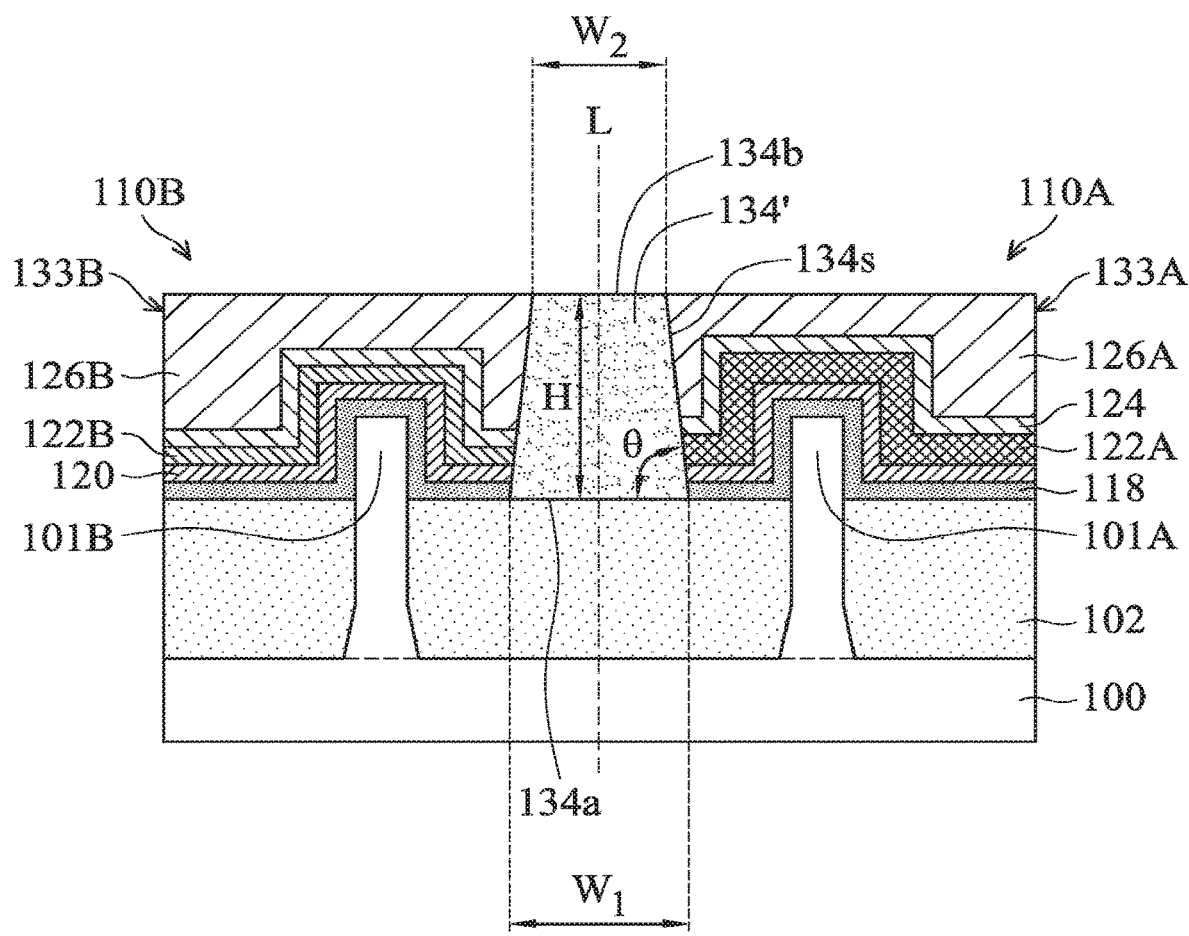

Afterwards, the portion of the dielectric layer 134 outside of the recess 132 is removed until the metal fillings 126A and 126B are exposed, as shown in FIGS. 1I and 2O. In some embodiments, a planarization process is used to partially remove the dielectric layer 134. The planarization process may include a CMP process, a grinding process, an etching process, another applicable process, or a combination thereof. As a result, the portion of the dielectric layer 134 remaining in the recess 132 forms the isolation element 134', as shown in FIGS. 1I and 2O in accordance with some embodiments.

Many variations and/or modifications can be made to embodiments of the disclosure. In some embodiments, the isolation element 134' includes a multilayer structure. For example, multiple dielectric layers are deposited to fill the recess 132. Similarly, a planarization process may be performed to remove the multiple dielectric layers outside of the recess 132. As a result, the multiple dielectric layers remaining in the recess 132 form the isolation element 134'.

As shown in FIGS. 1I and 2O, the isolation element 134' is adjacent to the gate stacks 133A and 133B, in accordance with some embodiments. In some embodiments, the isolation element 134' is in direct contact with the work function layers 122A and 122B and the metal fillings 126A and 126B of the gate stacks 133A and 133B, as shown in FIG. 1I. In some embodiments, the isolation element 134' is also in direct contact with the gate dielectric layer 118 of the gate stacks 133A and 133B. In some embodiments, the isolation element 134' is also in direct contact with the isolation feature 102, as shown in FIG. 1I.

As shown in FIG. 1I, the isolation element 134' has an upper side 134b and a lower side 134a between the upper side 134b and the semiconductor substrate 100. In some embodiments, the upper side 134b has a width equal to the width $W_2$, and the lower side 134a has a width equal to the width $W_1$. In some embodiments, the lower side 134a is wider than the upper side 134b. However, it should be appreciated that embodiments of the disclosure are not limited thereto. In some other embodiments, the upper side 134b is wider than the lower side 134a. In some other embodiments, the upper side 134b is substantially as wide as the lower side 134a.

As shown in FIG. 1I, the isolation element 134' has a sidewall 134s. The angle θ is between the sidewall 134s and the lower side 134a (or the bottom) of the isolation element 134'. In some embodiments, the angle θ is in a range from about 10 degrees to about 85 degrees. In some other embodiments, the angle θ is in a range from about 20 degrees to about 70 degrees.

As shown in FIGS. 1I and 2G, two transistors each including the gate stacks 133A and 133B are formed, in accordance with some embodiments. The isolation element 134' is formed between ends of the gate stacks 133A and 133B to electrically isolate the gate stack 133A from the gate stack 133B. The gate dielectric layer and the work function layer are in direct contact with lower portions of the isolation element 134', and the metal filling is in direct contact with an upper portion of the isolation element 134'. Because each of the gate stacks is formed by patterning the metal gate stack layers, the height of the gate stack may be well controlled. In some embodiments, no planarization needs to be performed to ensure that different gate stacks have the same height. Therefore, the associated processing cost and processing time are reduced. The residues generated during the planarization process are also reduced.

Embodiments of the disclosure form a semiconductor device structure with one or more metal gate stacks and fin structures. A dummy gate stack line is removed to form a trench where more than two metal gate stacks will be formed. Metal gate stack layers are formed to fill the trench. Afterwards, one or more recesses are formed in the metal gate stack layers to separate the metal gate stack layers into two or more metal gate stacks. One or more isolation elements are formed afterwards in the recesses to electrically isolate the metal gate stacks. Since the metal gate stack layers are deposited in the trench which is large enough to contain two or more gate stacks, the deposition of the metal gate stack layers can be performed well. The quality and the reliability of the metal gate stack layers are improved significantly.

In accordance with some embodiments, a semiconductor device structure is provided. The semiconductor device structure includes a fin structure over a semiconductor substrate. The semiconductor device structure also includes a gate stack covering a portion of the fin structure, and the gate stack includes a work function layer and a metal filling over the work function layer. The semiconductor device structure further includes an isolation element over the semiconductor substrate and adjacent to the gate stack. The isolation element is in direct contact with the work function layer and the metal filling.

In accordance with some embodiments, a semiconductor device structure is provided. The semiconductor device structure includes semiconductor device structure. The semiconductor device structure also includes a first gate stack covering a portion of the first fin structure and a second gate stack covering a portion of the second fin structure. The semiconductor device structure further includes an isolation element over the semiconductor substrate and between the first gate stack and the second gate stack. The isolation element is in direct contact with a first work function layer and a first metal filling of the first gate stack and a second work function layer and a second metal filling of the second gate stack.

In accordance with some embodiments, a method for forming a semiconductor device structure is provided. The method includes forming a first fin structure and a second fin structure over a semiconductor substrate. The method also includes forming a dummy gate stack over the semiconductor substrate to partially cover the first fin structure and the second fin structure. The method further includes removing the dummy gate stack to form a trench over the semiconductor substrate and forming metal gate stack layers in the trench. In addition, the method includes forming at least one recess in the metal gate stack layers to separate the metal gate stack layers into at least two gate stacks and forming an isolation element in the at least one recess.

One general aspect of embodiments disclosed herein includes a semiconductor device including: a first fin element having a longitudinal axis extending in a first direction; a first gate stack extending over the first fin element and having a longitudinal axis extending in a second direction perpendicular to the first direction, the first gate stack having a first end and a second end separated along the second direction; a second fin element having a longitudinal axis extending in the first direction; a second gate stack extending over the second fin element, the second gate stack extending in the second direction and having a first end and a second end separated along the second direction; and an isolation element between the first end of the first gate stack and the first end of the second gate stack, where the isolation element contacts the first end of the first gate stack and further contacts the first end of the second gate stack.

Another general aspect of embodiments disclosed herein includes a semiconductor device, including: a first fin element having a longitudinal axis extending in a first direction and having a first end and a second end separated along the first direction; a second fin element having a longitudinal axis extending in the first direction and having a first end and a second end separated along the first direction; a gate electrode material extending in a second direction perpendicular to the first direction and extending over the first fin element and the second fin element; and where the gate electrode material is divided by an isolation element into at least a first portion and a second portion, the isolation element extending from a topmost surface of the gate electrode material to a topmost surface of an isolation layer, the isolation layer at least partially surrounding a lower portion of the first fin element and a lower portion of the second fin element.

Yet another general aspect of embodiments disclosed herein includes a semiconductor device including: a substrate having extending therefrom a first fin and a second fin;

a p-type transistor formed in the first fin, the p-type transistor including a first metal gate electrode, the first metal gate electrode having an end terminating at a first sidewall of an isolation element; an n-type transistor formed in the second fin adjacent the first fin, the n-type transistor including a second metal gate electrode, the second metal gate electrode having an end terminating at a second sidewall of the isolation element, opposite the first sidewall; and where the first sidewall forms an acute angle θ relative to a major surface of the substrate and the second sidewall forms an acute angle θ r relative to the major surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first fin element having a longitudinal axis extending in a first direction;
   a first gate stack extending over the first fin element and having a longitudinal axis extending in a second direction perpendicular to the first direction, the first gate stack having a first end and a second end separated along the second direction;
   a second fin element having a longitudinal axis extending in the first direction;
   a second gate stack extending over the second fin element, the second gate stack extending in the second direction and having a first end and a second end separated along the second direction; and
   an isolation element between the first end of the first gate stack and the first end of the second gate stack, wherein the isolation element contacts the first end of the first gate stack and further contacts the first end of the second gate stack, and further wherein the isolation element extends from a topmost surface of the first gate stack to a topmost surface of an isolation layer, the isolation layer at least partially surrounding a lower portion of the first fin element, and wherein the isolation element has a first width, extending along the second direction, at a topmost surface of the isolation element and a second width, extending along the second direction, at a bottommost surface of the isolation element, and wherein the second width is greater than the first width.

2. The semiconductor device of claim 1, further comprising a spacer element extending along a sidewall of the first gate stack, along a sidewall of the isolation element and along a sidewall of the second gate stack.

3. The semiconductor device of claim 1, wherein the first gate stack includes a first work function metal layer and the second gate stack includes a second work function metal layer different than the first work function metal layer.

4. The semiconductor device of claim 3, wherein the first work function metal layer is thicker than the second work function metal layer.

5. The semiconductor device of claim 1, wherein the first gate stack comprises a gate dielectric layer between the first fin element and a work function layer, and the gate dielectric layer is in direct contact with the isolation element.

6. The semiconductor device of claim 1, further comprising an isolation feature between the gate stack and a semiconductor substrate upon which the first fin element is formed, wherein the isolation element is in direct contact with the isolation feature.

7. The semiconductor device of claim 1, further comprising:
   a first gate dielectric layer between the first fin element and a first work function layer of the first gate stack; and
   a second gate dielectric layer between the second fin element and a second work function layer of the second gate stack, wherein the isolation element is in direct contact with the first gate dielectric layer and the second gate dielectric layer.

8. The semiconductor device as claimed in claim 7, wherein materials of the first gate dielectric layer and the second gate dielectric layer are the same.

9. A semiconductor device, comprising:
   a first fin element having a longitudinal axis extending in a first direction and having a first end and a second end separated along the first direction;
   a second fin element having a longitudinal axis extending in the first direction and having a first end and a second end separated along the first direction;
   a gate electrode material extending in a second direction perpendicular to the first direction and extending over the first fin element and the second fin element; and
   wherein the gate electrode material is divided by an isolation element into at least a first portion and a second portion, the isolation element extending from a topmost surface of the gate electrode material to a topmost surface of an isolation layer, the isolation layer at least partially surrounding a lower portion of the first fin element and a lower portion of the second fin element, wherein the first portion and second portion have respective top surfaces and respective bottom surfaces and wherein the respective bottom surfaces are separated from each other by a first distance that is greater than a second distance separating the respective top surfaces.

10. The semiconductor device of claim 9, wherein the first portion and the second portion of the gate electrode material differ by a composition of a work function metal layer.

11. The semiconductor device of claim 9, wherein the isolation element comprises a material selected from the group consisting of silicon oxide, silicon nitride, silicon oxynitride, carbon-containing silicon oxide, and combinations thereof.

12. The semiconductor device of claim 9, wherein the first portion and the second portion are respectively located in a common trench, the common trench extending across a plurality of fin elements.

13. The semiconductor device of claim 9, further comprising a p-type transistor formed in the first fin element and an n-type transistor formed in the second fin element.

14. A semiconductor device comprising:
   a substrate having extending therefrom a first fin and a second fin;
   a p-type transistor formed in the first fin, the p-type transistor including a first metal gate electrode, the first metal gate electrode having an end terminating at a first sidewall of an isolation element;
   an n-type transistor formed in the second fin adjacent the first fin, the n-type transistor including a second metal gate electrode, the second metal gate electrode having an end terminating at a second sidewall of the isolation element, opposite the first sidewall; and
   wherein the first sidewall extends away from the first metal gate electrode when going from the bottom of the first sidewall to the top of the first sidewall at an acute angle $\theta$ relative to a major surface of the substrate and the second sidewall extends away from the first metal gate electrode when going from the bottom of the first sidewall to the top of the first sidewall at an acute angle $\theta r$ relative to the major surface of the substrate.

15. The semiconductor device of claim 14, further comprising:
   an isolation layer surrounding sidewalls of the first fin and the second fin;
   wherein the first metal gate electrode extends over the isolation layer and the second metal gate electrode extends over the isolation layer; and
   wherein the isolation element contacts the isolation layer.

16. The semiconductor device of claim 14, further comprising a spacer element extending from the first gate electrode, past the isolation element, and to the second gate electrode.

17. The semiconductor device of claim 14, wherein the isolation element comprises a material selected from the group consisting of silicon oxide, silicon nitride, silicon oxynitride, carbon-containing silicon oxide, and combinations thereof.

18. The semiconductor device of claim 14, further including epitaxial source/drain regions in the first fin.

* * * * *